US006555451B1

(12) United States Patent
Kub et al.

(10) Patent No.: US 6,555,451 B1
(45) Date of Patent: Apr. 29, 2003

(54) METHOD FOR MAKING SHALLOW DIFFUSION JUNCTIONS IN SEMICONDUCTORS USING ELEMENTAL DOPING

(75) Inventors: Francis J. Kub, Arnold, MD (US); Karl D. Hobart, UpperMarlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/964,545

(22) Filed: Sep. 28, 2001

(51) Int. Cl.$^7$ ............................................. H01L 21/22
(52) U.S. Cl. .................... 438/542; 438/423; 438/475; 438/510; 438/514; 438/515; 438/517; 438/522; 438/559; 438/565; 438/664; 438/682; 438/766; 438/914; 438/961
(58) Field of Search ................................ 438/423, 475, 438/510, 514, 515, 517, 522, 542, 559, 565, 664, 682, 766, 914, 961

(56) References Cited

U.S. PATENT DOCUMENTS

| 4,392,453 | A | * | 7/1983 | Luscher ...................... 117/108 |
| 4,804,438 | A | * | 2/1989 | Rhodes ........................ 438/660 |
| 4,951,603 | A | * | 8/1990 | Yoshino et al. ............. 118/719 |
| 5,151,765 | A | * | 9/1992 | Yamauchi ................... 257/553 |
| 5,183,777 | A | * | 2/1993 | Doki et al. ......... 148/DIG. 144 |
| 5,242,859 | A | * | 9/1993 | Degelormo et al. ........ 438/565 |
| 5,256,162 | A | * | 10/1993 | Drowley et al. ............. 118/715 |
| 5,310,711 | A | * | 5/1994 | Drowley et al. ............. 438/565 |
| 5,374,564 | A | | 12/1994 | Bruel |
| 5,391,257 | A | | 2/1995 | Sullivan et al. |
| 5,401,544 | A | | 3/1995 | Nakahata et al. |

(List continued on next page.)

OTHER PUBLICATIONS

Francis J. Kub et al, "Method for Making Piezoelectric Resonator and Surface Acoustic Wave Device Using Implant Layer Splitting", NC 79,598, Ser. No. Not yet assigned, Pending Application, Filed Feb. 22, 2002.

Francis J. Kub, et al, "Method of Transferring Thin Film Functional Material to a Semiconductor Substrate or Optimized Substrate Using a Hydrogen Splitting Technique", NC 79,682, Pending Application, Filed Mar. 29, 2002.

Francis J. Kub et al, "Method for Making Piezoelectric, Electro–optical and Decoupling Capacitors Using Thin Film Transfer and Hydrogen Ion Splitting Techniques", NC 79,719, Ser. No. Not yet assigned, Pending Application, Filed Mar. 18, 2002.

(List continued on next page.)

Primary Examiner—Kamand Cuneo
Assistant Examiner—Lisa Kilday
(74) Attorney, Agent, or Firm—Joseph T. Grunkemeyer; John J. Karasek

(57) ABSTRACT

A method is provided for making ultra-shallow diffused junctions using an elemental dopant. A semiconductor wafer is cleaned for providing a clean reaction surface. The cleaned wafer in loaded onto a stage located in a doping system. A quantity of elemental dopant atoms are placed in a partially enclosed elemental dopant source which is within a secondary vacuum enclosure. A quantity of the elemental dopant atoms having thermal velocities are deposited onto a surface of the wafer, and the wafer is heated for diffusing the elemental dopant into the wafer. In one embodiment, the heating is conducted by heating the wafer in ultra-high vacuum for diffusing the portion of the doping atoms into the wafer, and the deposition and heating occur simultaneously. In another embodiment, the surface of the wafer is hydrogen terminated, the wafer is removed from the UHV system, and the heating of the wafer is conducted outside of the UHV system by heating the wafer in a furnace. Preferably, a cap layer is added to protect the wafer. The method results in ultra-shallow diffused junctions having a depth of as shallow as about 10 nm.

39 Claims, 3 Drawing Sheets

U.S. PATENT DOCUMENTS

| | | | |
|---|---|---|---|
| 5,446,330 | A | 8/1995 | Eda et al. |
| 5,448,126 | A | 9/1995 | Eda et al. |
| 5,630,949 | A | 5/1997 | Lakin |
| 5,714,395 | A | 2/1998 | Bruel |
| 5,866,472 | A * | 2/1999 | Moslehi .................. 438/513 |
| 5,877,070 | A | 3/1999 | Goesele et al. |
| 5,882,987 | A | 3/1999 | Srikrishnan |
| 5,966,620 | A | 10/1999 | Sakaguchi et al. |
| 5,993,677 | A | 11/1999 | Biasse et al. |
| 5,994,207 | A | 11/1999 | Henley et al. |
| 6,010,579 | A | 1/2000 | Henley et al. |
| 6,020,252 | A | 2/2000 | Aspar et al. |
| 6,037,640 | A * | 3/2000 | Lee ....................... 257/344 |
| 6,054,370 | A | 4/2000 | Doyle |
| 6,103,597 | A | 8/2000 | Aspar et al. |
| 6,313,014 | B1 * | 11/2001 | Sakaguchi et al. .......... 257/347 |
| 6,328,796 | B1 | 12/2001 | Kub et al. |

OTHER PUBLICATIONS

Francis J. Kub et al, Method for Making Electro–Optical Devices Using a Hydrogen Ion Splitting Technique, NC 79,639, Ser. No. 09/985,958, Pending Application, Filed Oct. 29, 2001.

Francis J. Kub et al, "Method of Manufacturing a Semiconductor Device Having a Thin GaN Material Directly Bonded to an Optimized Substrate", NC 79,313, Ser. No. 09/964,546, Pending Application, Filed Sep. 28, 2001.

Francis J. Kub et al, Method for Transferring Thin Film Layer Material to a Flexible Substrate Using a Hydrogen Ion Splitting Technique, NC 79,684, Ser. No. 10/022,364, Pending Application, Filed Dec. 20, 2001.

Francis J. Kub et al, Method for Making Mosaic Array of Thin Semiconductor Material of Large Substrates, NC 79,225, Ser. No., 10/046,534, Pending Application, Filed Jan. 16, 2002.

M. Bruel, Electronics Letters, Jul. 6th, 1995, vol. 31, No. 14, Silicon On Insulator Material Technology.

Q.Y. Yong, 1997 American Institute of Physics (S0003–6951 (97) 03211), Layer Splitting Process in Hydrogen–Implanted Si, Ge, SiC, and Diamond Substrates.

B. Aspar et al, Journal of Electronic Materials, vol. 30, No., 7, 2001, The Generic Nature of the Smart–Cut Process for Thin Film Transfer.

K.D. Hobart et al, Electronics Letters, Jun. 11th, 1998, vol. 34 No. 12, Fabrication of SOI Substrates with Ultra–Thin Si Layers.

K.D. Hobart et al, Electronics Letters, Apr. 15th, 1999, vol. 35, No. 8, Transfer of GaSb Thin Film to Insulating Substrate Via Separation by Hydrogen Implantation.

F.J. Kub et al, Electronics Letters, Mar. 18th, 1999, vol. 35, No. 6, Single–Crystal Ferroelectric Microwave Capacitor Fabricated by Separation by Hydrogen Implantation.

* cited by examiner

METHOD FOR MAKING SHALLOW DIFFUSION JUNCTIONS IN SEMICONDUCTORS USING ELEMENTAL DOPING

BACKGROUND OF THE INVENTION

1. Field of the invention

This invention relates generally to the doping of a semiconductor substrate to create conductive junctions and circuits, and more specifically, relates to a method for the creation of ultra-shallow doping junctions using elemental doping.

2. Related Art

As our society has become more technology based, semiconductors have come to play a vital role. Semiconductor wafers with accompanying circuitry are commonly used in the manufacture of such everyday items as televisions, radios, and computers. The process of manufacturing semiconductors (which are commonly called chips) typically consists of more than 100 steps, during which hundreds of copies of an integrated circuit are formed on a single wafer. The wafer is commonly a silicon dioxide (SiO2) substrate with electrically conductive surface circuits patterned upon the substrate. The circuits may be of near microscopic size and thickness.

Semiconductor devices have many and varied applications in electrical engineering. Recent engineering developments have yielded extremely small semiconductor chips containing hundreds of thousands of transistors. These chips have made possible great miniaturization of electronic devices.

One of the more important steps in semiconductor manufacture is doping. Doping is the addition of elements other than silicon to provide conductivity within the circuit. P-N junctions are commonly created to assist circuit conductivity. Silicon has four valance electrons. Atoms with one valance electron less than silicon, such as boron, or one more valance electron than silicon, such as phosphorus, are introduced into an area desired for conductivity. The addition of the elements alters the electrical character of the silicon. An element with one less valance electron than silicon, usually boron, creates a "positive hole", or P-type area, as compared to the silicon substrate. An element having one more valance electron than silicon, usually phosphorus, creates a more negative, or N-type area. Electrical conduction can take place between the N and P areas, altering the electrical character of the silicon. In other words, when the P-type and N-type semiconductor regions are adjacent to each other, the regions form a semiconductor diode, and the region of contact is called a P-N junction. A diode is a two-terminal device that has a higher resistance to electric current in one direction and a lower resistance in the opposite direction. The conductive properties of the P-N junction depends on the direction of the applied voltage, which can, in turn, be used to control the directional nature of the device. Therefore, P-N junctions can be used to direct the electrical current flow in a semiconductor in a specific direction. Series of such junctions are used to make transistors in many semiconductor devices. Such semiconductor devices include, among others, solar cells, lasers, and rectifiers.

More efficient use of semiconductor chips has been developed through what is called complementary metal-oxide semiconductor circuitry, or CMOS circuitry, formed by pairs of P and N channel transistors controlled by a single circuit.

In creating P-N junctions, the ideal is to create junctions that are as shallow as possible. The more shallow a junction can be made, yet still remain effective in conducting electricity, the more efficient will be the conduction of electricity. Conversely, the greater the diffusion of the P-N dopant into the substrate, the lower the efficiency of the conduction of electricity through the semiconductor circuit.

Shallow P+ and N+ junctions are required for future generations of VLSI transistors made on bulk silicon substrates and ultra-thin SOI, for hyperabrupt P+ junctions for Esaki tunnel diodes, for shallow P layers to control the threshold voltage of P-channel MOSFETs, and for making thin silicon layers for compliant substrates by using P+ layers as an etch stop along with a hydrogen ion implant layer splitting approach.

Two principal methods of creating shallow P-N dopant junctions upon the semiconductor surface are ion implantation and heat diffusion. In an ion implantation method, ions of the dopant are fired at the wafer surface and embedded therein. In a heat diffusion method, ions of the dopant are placed upon the surface of the wafer and diffused therein with heat. Ion implantation suffers from the limitation that the ion impacts cause damage to the surrounding silicon matrix. This damage interferes with the efficiency and conductivity of electricity conduction. Heat diffusion has a serious limitation as well. Heat diffusion tends to diffuse the dopant too greatly, reducing conductive efficiency.

Shallow junctions in silicon are commonly made by implanting ions using low implantation energy. Implant energies from 1 KeV to 10 KeV are currently being investigated for forming ultra-shallow junctions. However, impacts from ion implantation still create point defects in the semiconductor lattice that can lead to enhanced diffusion of the dopant atom making it difficult to achieve ultra-shallow junctions. To our knowledge, the shallowest junction made to date using ion implantation are on the order of 30–50 nm deep into the semiconductor.

Some attempts have been made within the art to improve the quality of semiconductor junctions. Prior art of interest in the field of doping semiconductor substrate surfaces includes U.S. Pat. No. 6,037,640 (Lee); U.S. Pat. No. 5,866,472 (Noslehi); U.S. Pat. No. 5,310,711 (Drowley et al.); U.S. Pat. No. 5,256,162 (Drowley et al.); U.S. Pat. No. 5,242,859 (Degelomo et al.); U.S. Pat. No. 5,183,777 (Doki et al.); U.S. Pat. No. 4,951,603 (Yoshino et al.); U.S. Pat. No. 4,804,438 (Rhodes); and U.S. Pat. No. 4,392,453 (Luscher). The Lee patent discloses a method for making junctions by co-implanting a non-dopant at a higher energy and at a greater depth than the dopant ion. The low energy, dopant implantation step is followed by a fast isothermal annealing step. Junctions 10–45 nanometers deep are said to be created. The Noslehi, Drowley et al. ('711 and '162) and Degelomo et al. patents each disclose thermally activated direct gas phase doping methods. The direct diffusion of the dopant gas creates heavily doped junctions. These gas phase dopant methods are said to have the potential of creating junctions at a depth of 1000 A (100 nm) or less. The Doki et al. patent discloses an implantation method which involves the formation of a dopant containing film on the surface of a silicon substrate. After the formation of the film, which is composed of hydrogen compounded with either boron, phosphorus, or arsenic, the substrate is heated to cause diffusion. This method is said to create junctions at a depth of 1000 A (100 nm) or less. The Yoshino et al., Rhodes, and Luscher patents each involve the use of vacuum systems in the production of semiconductors. The Yoshino et al. patent discloses an apparatus which deposits semiconductor layers on a substrate in a vacuum chamber. The Rhodes patent discloses a method for depositing conductive layers on silicon substrates under vacuum. The Luscher patent discloses a method for producing a semiconductor film through the use of molecular beams which coat the wafer in a vacuum system.

SUMMARY OF THE INVENTION

In accordance with the invention, a method is provided for making ultrashallow diffused junctions using an elemental dopant.

The method is comprised of the steps of cleaning a semiconductor wafer so as to provide a clean reaction surface, loading the cleaned wafer onto a stage located in a vacuum system, placing a quantity of elemental dopant atoms in a partially enclosed elemental dopant source located within a secondary vacuum enclosure, depositing a quantity of the elemental dopant atoms having thermal velocities onto the surface of the wafer, heating the wafer so as to diffuse the elemental dopant atoms into the wafer, and removing the wafer from the vacuum system.

Advantageously, the heating comprises heating the wafer in an ultra-high vacuum so as to diffuse the portion of the doping atoms into the wafer.

Preferably, the heating comprises heating the wafer to a temperature of about 700 C. to about 900° C.

Preferably, the deposition and heating steps are carried out simultaneously.

Advantageously, the method further comprises the steps of hydrogen terminating the surface of the wafer.

Preferably, the hydrogen termination of the wafer surface is carried out before loading of the wafer into the system is carried out, and removal of the hydrogen is carried out after the wafer is loaded into the system.

Preferably, the terminated hydrogen is removed from the surface of the wafer. Advantageously, the hydrogen-removal is carried out by heating the wafer by using at least one flash lamp to a temperature of at least 450° C.

Advantageously, at least part of the surface of the wafer is covered with a layer of photoresist, and the method further comprises the step of removing the photoresist from the wafer after the wafer is removed from the vacuum system and before the wafer is heated.

Preferably, at least one protective layer is deposited on the surface of the wafer. Advantageously, the protective layer is a cap layer consisting of one of silicon, a nitride, and a metal. Preferably, the at least one protective layer comprises two to five layers of an elemental dopant.

Advantageously, a silicide layer is deposited on the surface of the wafer, and the silicide layer is deposited prior to deposition of the elemental dopant on the wafer.

Preferably, the wafer is comprised of a material selected from the group consisting of silicon, GaAs, SiC, and GaN.

Advantageously, the elemental dopant is selected from the group consisting of boron, phosphorus, antimony, indium, aluminum, arsenic, and gallium.

Preferably, the elemental dopant is boron.

Advantageously, the method produces diffused junctions having a depth of up to about 500 nm.

Preferably, the diffused junctions have a depth of up to about 10 nm.

Preferably, the vacuum system is operated at a pressure of between about $10^{-6}$ torr to about $10^{-11}$ torr.

Advantageously, the wafer is maintained at a temperature beneath ambient room temperature during deposition of the elemental dopant.

Preferably, the wafer is maintained at ambient room temperature during deposition of the elemental dopant Advantageously, the wafer is maintained at a temperature above ambient room temperature during deposition of the elemental dopant.

Preferably, the wafer is maintained at a temperature from about 200° C. to about 500° C. during deposition of the elemental dopant.

Advantageously, the wafer is maintained at a temperature of less than about 200° C. during deposition of the elemental dopant.

Preferably, the method is used to create junctions in a VLSI transistor.

Advantageously, the method is used in a process to create esaki tunnel diodes.

Preferably, the method is used in a process to create P-channel MOSFETs.

Preferably, the method further comprises the steps of implanting a layer of hydrogen ions in a layer within the wafer; and separating the wafer along the hydrogen ion layer using a hydrogen ion layer splitting technique.

Advantageously, the dopant source is heated by a heat source comprising one of a K-cell, an electron beam, and an in source heater.

In accordance with a further aspect of the invention, a method of the invention comprises preparing a surface of a wafer to be doped, and doping the wafer by exposing the reaction surface to an elemental boron dopant so that the boron is deposited on and adheres to the surface and diffuses into the surface so as to produce a doped wafer.

Preferably, the wafer is heated to provide annealing thereof.

Advantageously, the hydrogen termination step comprises the step of removing any native oxide on the surface.

Advantageously, the flashing off of hydrogen is carried out in an ultra high vacuum.

Preferably, the doping step is carried out after the flashing off of the hydrogen.

Preferably, the doping step is carried out with the surface being hydrogen terminated.

Advantageously, the wafer comprises silicon and, after the hydrogen terminator step, the wafer is heated to no more than about 400° C., the element boron doping step is carried out, and the wafer is flash heated to 700–900° C. to diffuse the boron into the silicon.

The approaches described herein allow the creation of junctions of less than 10 nm thickness without damaging the surrounding silicon.

Other features and advantages of the invention will be set forth in, or will be apparent from, the detailed description of the preferred embodiments which follows.

DESCRIPTION OF THE PREFERRED EMBODIMENTS

An apparatus and method for making ultra-shallow diffused junctions in semiconductor wafers by using elemental doping atoms will now be described with relation to preferred embodiments of the invention.

Figure 1:
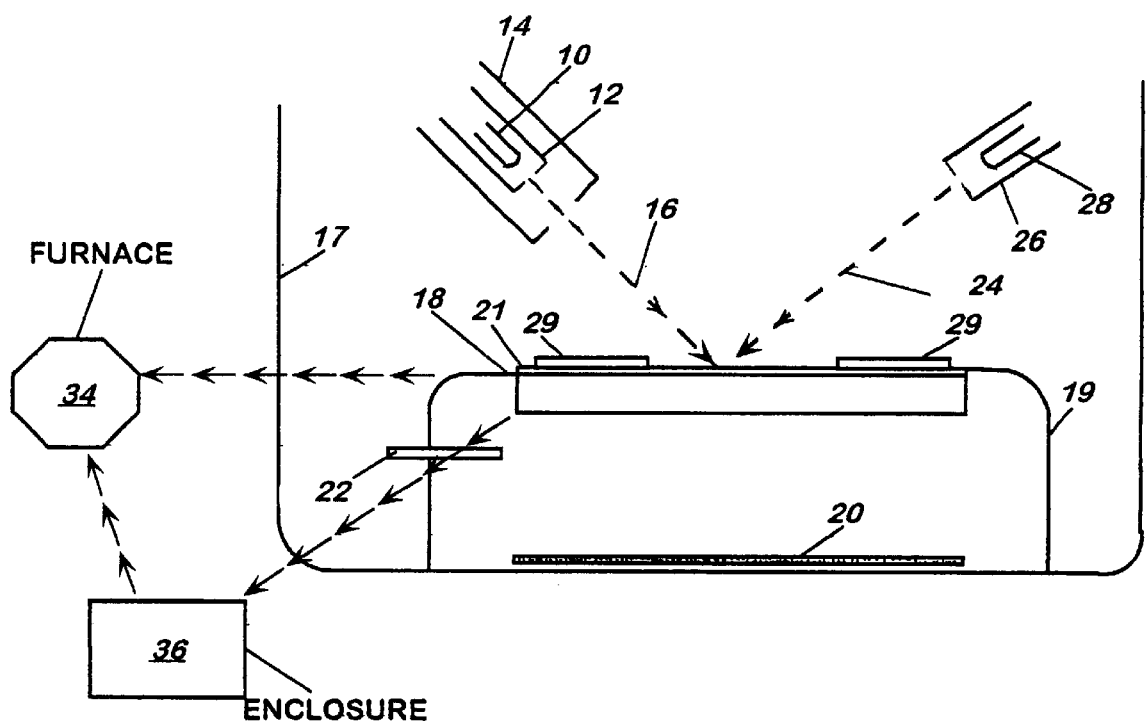
FIG. 1 is a side elevational view of a preferred embodiment of apparatus used in the elemental doping method of the invention.

Referring first to FIG. 1, a preferred embodiment of the apparatus of the invention is shown. An elemental dopant source 10 is enclosed within a pair of vacuum enclosures 12 and 14. A supply of elemental atoms, which have thermal energies (thermal velocities), is placed in the elemental dopant source 10. The thermal velocities of the dopant atoms are maintained by heating the atoms within the dopant source 10. The elemental dopant source 10 can include a K-cell heated, E-Beam heated, or insource heated source. The preferred elemental dopant in this embodiment is boron.

The dopant source enclosure 12 encloses the dopant source 10. The dopant source 10, a semiconductor silicon wafer 18 and associated apparatus described below are all enclosed with a vacuum chamber 17 which is used to maintain under vacuum the dopant atoms deposited upon the wafer 18. Further, the secondary vacuum enclosure 14 encloses the dopant source enclosure 12 and provides a secondary vacuum. The use of the pair of vacuum enclosures 12 and 14 insures a high quality ultra high vacuum (UHV). This is necessary because a good vacuum is needed to prevent oxygen from bonding with the elemental atoms within the dopant source 10 since such bonding would otherwise sharply reduce the quality of the dopant.

The semiconductor wafer 18 is held by a stage or support 19. The stage 19 can be used to heat the wafer 18 to an elevated temperature, cool the wafer to cryogenic temperature or allow the wafer temperature to remain at room temperature during the time that the stream of dopant atoms 16 is being deposited on the wafer 18. Therefore, the wafer 18 can be maintained at cryogenic temperatures, room temperature, or at an elevated temperature while the dopant atoms 16 are impinging onto, and absorbing to, the surface of the wafer 18. The temperature at which the wafer 18 is maintained may depend upon process conditions, results desired, or other factors. Other components of the apparatus of FIG. 1 will be described below.

Boron is a popular elemental dopant, and, as indicated above, is the preferred dopant here. An important reason for this is that boron has a sticking coefficient near unity (1.0) on a silicon surface. Therefore, there is a high probability that a boron atom landing on the silicon surface will absorb on the silicon surface. Because of the high sticking coefficient of boron, the doping approach herein has been experimentally demonstrated to work even when the silicon wafer is at approximately room temperature. In addition to boron, the elemental doping atoms used can include, phosphorous, antimony, indium, aluminum, arsenic, gallium, and the like.

In the preferred embodiment of the invention, silicon is used as a wafer material because it is inexpensive and adequate for most applications. In addition to silicon, however, wafer substrates can include GaAs, SiC, GaN, or other suitable materials.

Figure 2:
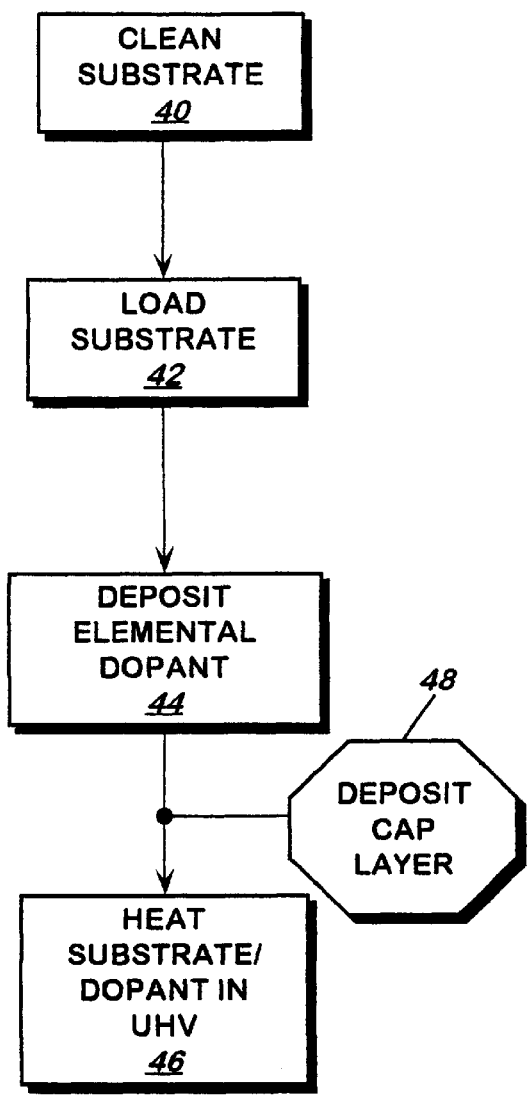
FIG. 2 is a schematic flow diagram of a first embodiment of the method of the invention.

Turning to the method of the invention, and referring to FIG. 2, in a preliminary step indicated by block 40, the surface of a semiconductor silicon wafer 18 is cleaned to remove organics and other contaminants. An acid clean such as RCA clean is often used to clean the silicon surface. An acid clean is not performed if photoresist 29 is on the surface. If photoresist 29 has been placed on the surface of the wafer 18, UV, ozone, or other cleaning technique is performed instead.

In the next step, indicated by block 42, the semiconductor wafer 18 is loaded into the process enclosure 17.

At this juncture, as indicated by block 44, the boron dopant atoms, which have thermal velocities, are deposited by the dopant stream 16 from the dopant source 10 onto the surface of the silicon wafer 18, i.e., as described above, the elemental boron dopant stream 16 is directed from the elemental dopant source 10 towards the surface of the wafer 18.

Next, as indicated by block 46, the wafer 18 is heated in the UHV to diffuse the boron located on, or buried slightly below, the surface of the wafer 18 into the bulk of the wafer 18. As indicated in FIG. 1, a wafer temperature measurement apparatus 22 is provided to monitor the temperature of the wafer 18. The concentration level of boron in the wafer 18 is normally at the solid solubility limit for the temperature at which the heating is performed.

It is to be understood that the deposition and heating steps can be performed separately as indicated above, or can be combined by raising the wafer 18 to an elevated temperature while depositing the stream of elemental boron dopant 16.

Alternatively, a modified version of this method can be used if warranted by circumstances or process conditions, i.e., where, e.g., there is photoresist 29 on the silicon wafer 18. In this alternative method, the diffusion heating of the wafer occurs after the wafer is taken out of the UHV system. This prevents damage to the photoresist 29.

Figure 3:
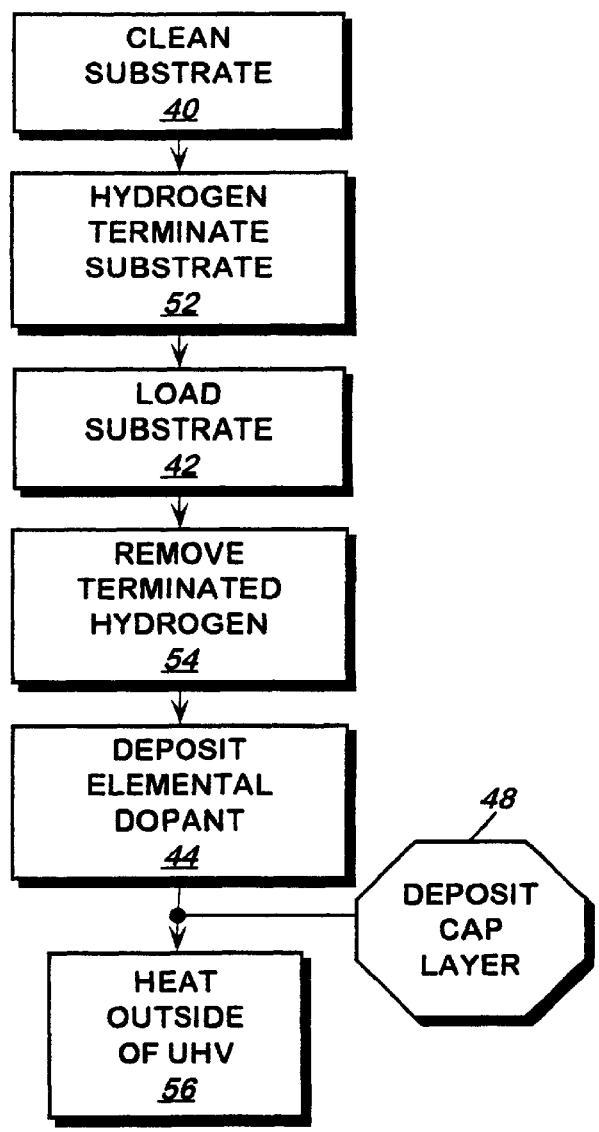
FIG. 3 is a schematic flow diagram of an embodiment of the method of the invention.

Turning to FIG. 3, a further alternative embodiment of the invention is shown. This embodiment is similar to that of FIG. 2 and corresponding blocks (steps) have been given the same reference numerals. In this embodiment, as indicated by block 52, the surface of the wafer 18 is terminated with hydrogen atoms before or during deposition of the dopant atoms. If the surface of the wafer 18 is hydrogen terminated to prevent oxidation, a 10:1 HF etch (with no water rinse or minimal water rinse) is typically used to simultaneously remove the native oxide and hydrogen terminate the silicon wafer surface 18. Other alternatives for removing the native oxide and hydrogen terminating the wafer surface 18 include using low energy hydrogen plasma and using HF vapor.

Next, the cleaned 40 and hydrogen terminated wafer is loaded into the UHV system as indicated by block 42. The vacuum level of the UHV system is typically in the range of $10^{-6}$ to $10^{-11}$ torr. The hydrogen on the surface of the wafer 18 is flashed off prior to depositing 44 the boron dopant stream 16. The removal of the hydrogen is indicated at block 54. The wafer temperature is raised above approximately 450° C. to remove the hydrogen. In a preferred embodiment, the wafer 18 is frequently heated using one of more of a plurality of flash lamp heaters 20 shown in FIG. 1.

Alternatively, the hydrogen may not be flashed off prior to absorbing the doping atoms. In this embodiment, the wafer surface 18 is heated to approximately 400° C., and the elemental boron is deposited. The substrate is heated by the flash heater 20 (FIG. 1) to 700–900° C. in vacuo to diffuse the boron into the silicon.

If photoresist 29 is present, the dopant atoms are deposited on the silicon at a low temperature since the photoresist 29 typically cannot take greater than 200° C. temperatures. If the wafer 18 is to be removed from UHV to strip the photoresist 29, the dopant must be protected from oxidation.

Figure 4:
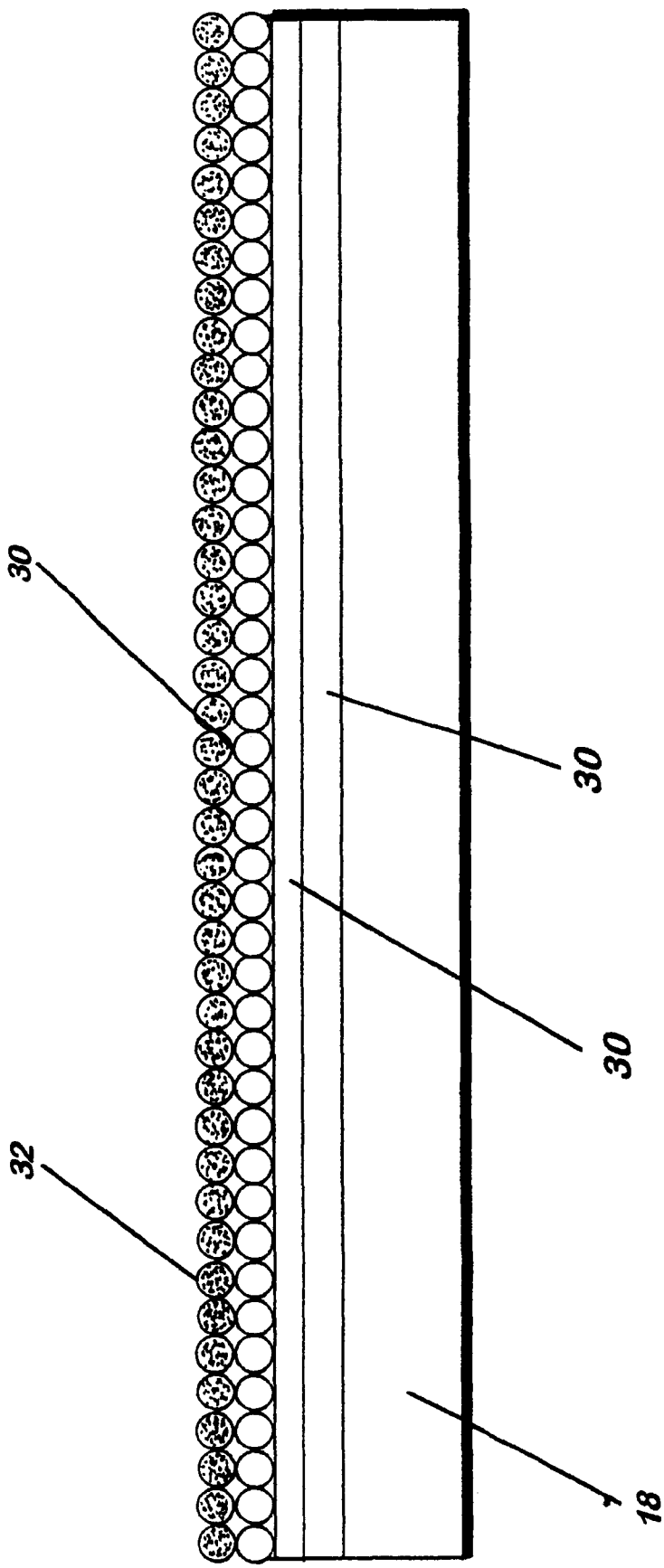
FIG. 4 is a side elevational view of a wafer prepared in accordance with a further alternative embodiment.

Referring again to FIG. 1 and also to FIGS. 2 to 4, in this embodiment, as shown in FIG. 1, a cap layer source 28 and enclosure 26 are used after doping to deposit a film cap layer 32 (see FIG. 4) on the dopant layer 30 (FIG. 4). The step of the deposition of the cap layer 32 is indicated by block 48 in FIGS. 2 and 3. The film cap layer 32 may consist of a thin (1–10 nm thick) layer of silicon (either amorphous, poly or single-crystal silicon), nitride, or metal. The purpose of the cap layer 32 is to prevent oxygen or other oxidizing agents from interacting with the dopant layer 30 if the wafer 18 is removed from the doping UHV system. The cap layer 32 can additionally be used to protect the dopant atom layer 30 during a resist strip operation. A third reason for the cap layer 32 is to prevent the dopant atom layer 30 from leaving the wafer surface 18 when the wafer 18 is heated to diffuse the dopant into the wafer 18.

Boron will not desorb from the wafer surface 18 when heated. However, dopant atoms such as phosphorous, arsenic, and antimony require a cap layer to prevent the dopant atoms from desorbing from the wafer surface 18 when the wafer 18 is heated. As indicated above and as is shown in FIG. 1, the cap layer is deposited 24 from the cap layer source 28 which is enclosed in the cap layer source enclosure 26. The cap layer 32 (FIG. 4) is usually deposited using E-beam source, K-Cell source, or in-source. If the elemental boron dopant layer 30 (FIG. 4) is capped by a thin silicon layer or nitride layer, then the silicon wafer 18 can be removed from the UHV system, resist stripped, and then annealed in a conventional furnace to drive the dopant into the silicon Returning again to FIG. 3, after the cap layer is deposited, the wafer 18 is removed from the vacuum system. The resist is stripped, and the wafer 18 is heated outside of the UHV, as indicated by block 56, to diffuse the dopant into the wafer surface. The resist may also be stripped while the wafer is in vacuum by using a plasma (not shown). As shown in FIG. 1, the wafer is transported to a separate external vacuum enclosure 36 to strip the resist. The wafer is heated in a conventional furnace or a RTA furnace, indicated at 34, in order to diffuse the dopant into the wafer 18.

An alternative approach to flash heating for removal of the hydrogen before deposition involves illuminating of the wafer with UV. Such UV illumination can be used to effectively remove hydrogen from the surface of the wafer 18. However, there is some experimental evidence that it is not necessary, under some circumstances, to remove the hydrogen from the surface of the wafer 18 in order to enable diffusion of the boron dopant into a silicon substrate. Therefore, the hydrogen may, in such circumstances, be left on the surface of the wafer 18 during deposition of the elemental dopant. The advantage of leaving the hydrogen on the surface of the wafer 18 during the doping is that a poor quality vacuum system can be used. If hydrogen is removed from the surface of the wafer 18 and the vacuum is poor, oxygen absorbs on the silicon surface very rapidly to replace the desorbed hydrogen. As stated herein, the presence of oxides will contaminate the elemental dopant atoms.

It is also noted that if the hydrogen is left on the surface of the wafer 18 during doping, the wafer 18 can then be removed from the vacuum system without the concern about oxide contamination, and then annealed in the furnace 34.

Even if the wafer is not heated to remove the hydrogen, it may still be advantageous to heat the wafer with the stand 19 (FIG. 1) to approximately 200° C. to drive off water vapor. At this temperature, the hydrogen remains on the wafer surface 18 during the dopant atom deposition.

There are other ways of protecting the dopant in addition to those described above. For example, the doping atoms can also be deposited on to a surface of a silicide layer, indicated at 21 in FIG. 1, placed on the upper surface of the wafer 18. The silicide layer 21 can be used to provide additional protection for the wafer 18. The presence of the layer 21 does not create a problem because many dopant atoms can diffuse rapidly through the silicide layer 21 to reach the wafer 18 and dope the silicon substrate.

In an advantageous embodiment, 2–5 monolayers of boron 30 are deposited on the wafer surface 18, as indicated in FIG. 4. In the embodiment of FIG. 4, 3 layers are shown deposited. The presence of several layers prevents full oxidation of the boron layer nearest the wafer surface when the wafer is taken out of the UHV system.

In addition, in order to increase its utilization, the doped substrate can be split off in layers and transferred to other preferred surfaces. A hydrogen implant approach can be used for splitting the layers.

It will be appreciated that the doping process described herein does not create crystal, or point, defects in the semiconductor lattice and thereby avoids effects such as transient enhanced diffusion. The fact that the process of the invention does not create crystal defects will theoretically improve device yield. Abrupt doping profiles can be obtained because of lack of enhanced diffusion effects. Shallow doping junctions are possible because a quantity of the dopant is not buried below the surface, as is the case for ion implantation.

The thermal energy of the atoms themselves (in their elemental form), together with the final heating step, cause the dopants to diffuse into the semiconductor substrate since the atoms are deposited on the surface of the wafer rather than being accelerated onto the surface, as is the case in ion implantation methods. Ultra-shallow junctions with abrupt doping profiles are formed because the dopant atoms do not infuse as extensively as in conventional "deposit and heat" methods. Accordingly, the invention is an attractive method of making extremely shallow P-junctions of 5 to 500 nm, particularly junctions less than 10 nm, within silicon surfaces.

Although the invention has been described above in relation to preferred embodiments thereof, it will be readily understood by those skilled in the art that variations and modifications can be effected in those embodiments without departing from the scope and spirit of the invention.

What is claimed is:

1. A method for making ultra-shallow diffused junctions using an elemental dopant, the method comprising the steps of:

cleaning a semiconductor wafer so as to provide a clean reaction surface;

loading the cleaned wafer onto a stage located in a vacuum system;

providing a quantity of elemental dopant atoms;

depositing a quantity of the elemental dopant atoms having thermal velocities onto the surface of the wafer;

heating the wafer so as to diffuse the elemental dopant atoms into the wafer; and removing the wafer from the vacuum system.

2. A method according to claim 1, wherein the heating step comprises heating the wafer in an ultra-high vacuum so as to diffuse the portion of the doping atoms into the wafer.

3. A method according to claim 1, wherein the heating step comprises heating the wafer to a temperature of about 700° C. to about 900° C.

4. A method according to claim 1, wherein the elemental dopant depositing step and heating step are carried out simultaneously.

5. A method according to claim 1, further comprising the step of:

hydrogen terminating the surface of the wafer.

6. A method according to claim 5, wherein the hydrogen terminating step is carried out before the loading step.

7. A method according to claim 5, further comprising the step of:
   flashing off the terminated hydrogen from the surface of the wafer.
8. A method according to claim 7, wherein the flashing off step is carried out by heating the wafer by using at least one flash lamp to a temperature of at least 450° C.
9. A method according to claim 7, wherein the flashing off of hydrogen is carried out in an ultra high vacuum.
10. A method according to claim 7 wherein the doping step is carried out after the flashing off of the hydrogen.
11. A method according to claim 5, wherein the hydrogen terminating step comprises removing native oxide from the surface.
12. A method according to claim 5 wherein the doping step is carried out with the surface being hydrogen terminated.
13. A method according to claim 5, wherein the wafer comprises silicon and, after the hydrogen terminating step, the wafer is heated to about 400° C., the element boron doping step is carried out, and the wafer is flash heated to 700–900° C. to diffuse the boron into the silicon.
14. A method according to claim 1, wherein a layer of photoresist covers at least part of the surface of the wafer, and the method further comprises the step of:
   stripping the photoresist from the wafer after the removing step and before the heating step.
15. A method according to claim 1, further comprising the step of:
   depositing at least one protective layer on the surface of the wafer.
16. A method according to claim 15, wherein the at least one protective layer comprises a cap layer selected from the group consisting of silicon, a nitride, and a metal.
17. A method according to claim 15, wherein the at least one protective layer comprises two to five layers of an elemental dopant.
18. A method according to claim 1, further comprising the step of:
   depositing a silicide layer on the surface of the wafer prior to the elemental dopant depositing step.
19. A method according to claim 1, wherein the wafer comprises a wafer material selected from the group consisting of silicon, GaAs, SiC, and GaN.
20. A method according to claim 1, wherein the elemental dopant is boron.
21. A method according to claim 1, wherein the elemental dopant is selected from the group consisting of boron, phosphorus, antimony, indium, aluminum, arsenic, and gallium.
22. A method according to claim 1, wherein said method produces shallow diffused junctions having a depth of up to about 500 nm.
23. A method according to claim 1, wherein the diffused junctions have a depth of up to about 10 nm.
24. A method according to claim 1, wherein the vacuum system is operated at a pressure of between about of $10^{-6}$ torr and about $10^{-11}$ torr.
25. A method according to claim 1, wherein the wafer is maintained at a temperature beneath ambient room temperature during the elemental dopant depositing step.
26. A method according to claim 1, wherein the wafer is maintained at ambient room temperature during the elemental dopant depositing step.
27. A method according to claim 1, wherein the wafer is maintained at a temperature above ambient room temperature during the elemental dopant depositing step.
28. A method according to claim 1, wherein the wafer is maintained at a temperature from about 200° C. to about 500° C. during the elemental dopant depositing step.
29. A method according to claim 1, wherein the wafer is maintained at a temperature less than about 200° C. during the elemental dopant depositing step.
30. A method according to claim 1, wherein the method is used to create junctions in a VLSI transistor.
31. A method according to claim 1, wherein the method is used to create esaki tunnel diodes.
32. A method according to claim 1, wherein the method is used to create P-channel MOSFETs.
33. A method according to claim 1, further comprising the steps of:
   implanting a layer of hydrogen ions in a layer within the wafer; and separating the wafer along the hydrogen ion layer using a hydrogen ion layer splitting technique.
34. A method according to claim 1, wherein the dopant source is heated by a heat source comprising one of a K-cell, an electron beam, and an in-source heater.
35. A method according to claim 1, further comprising heating the wafer to provide annealing thereof.
36. A method according to claim 1, wherein the heating step is done in a furnace and is carried out after the removing step.
37. The method of claim 1, wherein the dopant atoms selected from the group consisting of p-type dopants and n-type dopants.
38. The method of claim 1, wherein the quantity of elemental dopant atoms are placed in a partially enclosed elemental dopant source located within a secondary vacuum enclosure.
39. A method of forming shallow diffused junctions, the method comprising:
   preparing a surface of a wafer to be doped; and
   doping the wafer by exposing the reaction surface to an elemental boron dopant so that the boron is deposited on and adheres to the surface and diffuses into the surface so as to produce a doped wafer.

* * * * *